(12) United States Patent
Bizen et al.

(10) Patent No.: US 10,636,618 B2
(45) Date of Patent: Apr. 28, 2020

(54) CHARGED PARTICLE BEAM APPARATUS

(71) Applicant: HITACHI HIGH-TECHNOLOGIES CORPORATION, Minato-ku, Tokyo (JP)

(72) Inventors: Kaori Bizen, Tokyo (JP); Yasunari Sohda, Tokyo (JP); Makoto Sakakibara, Tokyo (JP); Hiroya Ohta, Tokyo (JP); Kenji Tanimoto, Tokyo (JP); Yusuke Abe, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 16/115,103

(22) Filed: Aug. 28, 2018

(65) Prior Publication Data
US 2019/0066969 A1 Feb. 28, 2019

(30) Foreign Application Priority Data

Aug. 30, 2017 (JP) .................. 2017-165432

(51) Int. Cl.
*H01J 37/153* (2006.01)
*H01J 37/20* (2006.01)
(Continued)

(52) U.S. Cl.
CPC ............ *H01J 37/153* (2013.01); *H01J 37/14* (2013.01); *H01J 37/1471* (2013.01);
(Continued)

(58) Field of Classification Search
CPC ...... H01J 37/153; H01J 37/14; H01J 37/1474; H01J 37/20; H01J 37/261; H01J 37/28; H01J 2237/1504; H01J 2237/153
(Continued)

(56) References Cited

U.S. PATENT DOCUMENTS

2010/0282596 A1  11/2010  Auth et al.
2011/0133080 A1   6/2011  Shishido et al.
(Continued)

FOREIGN PATENT DOCUMENTS

JP    2000156192 A    6/2000
JP    2007-187538 A   7/2007
(Continued)

OTHER PUBLICATIONS

Office Action dated Aug. 19, 2019 in counterpart Korean Application 10-2018-0090644.
(Continued)

*Primary Examiner* — Nicole M Ippolito
*Assistant Examiner* — Hanway Chang
(74) *Attorney, Agent, or Firm* — Miles & Stockbridge, P.C.

(57) ABSTRACT

There is provided a charged particle beam apparatus including: a charged particle source; a condenser lens and an object lens for converging a charged particle beam from the charged particle source and irradiating the converged charged particle beam to a specimen; and plural image shift deflectors for deflecting the charged particle beam. In the charged particle beam apparatus, the deflection of the charged particle beam is controlled using first control parameters that set the optical axis of a charged particle beam to a first optical axis that passes through the center of the object lens and enters a predefined position of the specimen, and second control parameters that transform the first control parameters so that the first control parameters set the optical axis of the charged particle beam to a second optical axis having a predefined incident angle different from the incident angle of the first optical axis.

15 Claims, 11 Drawing Sheets

(51) Int. Cl.
*H01J 37/14* (2006.01)
*H01J 37/28* (2006.01)
*H01J 37/26* (2006.01)
*H01J 37/147* (2006.01)

(52) U.S. Cl.
CPC .......... *H01J 37/1474* (2013.01); *H01J 37/20* (2013.01); *H01J 37/261* (2013.01); *H01J 37/265* (2013.01); *H01J 37/28* (2013.01); *H01J 2237/153* (2013.01); *H01J 2237/1504* (2013.01); *H01J 2237/281* (2013.01); *H01J 2237/2817* (2013.01)

(58) Field of Classification Search
USPC ...................... 250/396 R, 397, 398, 396 ML
See application file for complete search history.

(56) References Cited

U.S. PATENT DOCUMENTS

2012/0286160 A1   11/2012  Ohashi et al.
2016/0217967 A1*  7/2016   Dohi ..................... H01J 37/141

FOREIGN PATENT DOCUMENTS

| JP | 2011508943 A | 3/2011 |
| JP | 2012-234754 A | 11/2012 |
| JP | 201453074 A | 3/2014 |

OTHER PUBLICATIONS

Office Action dated Feb. 14, 2020 in counterpart Korean Application 10-2018-0090644.

* cited by examiner

| ACCELERATION VOLTAGE (kV) | DIFFERENCE | |
|---|---|---|
| | INTENSITY RATIO | RELATIVE ROTATION ANGLE (deg.) |
| 5 | 0.052 | 0.485 |
| 10 | 0.054 | 0.467 |
| 20 | 0.056 | 0.466 |
| 30 | 0.057 | 0.455 |
| 45 | 0.057 | 0.443 |
| 60 | 0.059 | 0.435 |

FIG. 4

| ACCELERATION VOLTAGE (kV) | OBJECT LENS CENTER AXIS | | DIFFERENCE (REPRESENTATIVE VALUE) | | INCIDENT ANGLE (deg.) |
|---|---|---|---|---|---|
| | INTENSITY RATIO | RELATIVE ROTATION ANGLE (deg.) | INTENSITY RATIO | RELATIVE ROTATION ANGLE (deg.) | |
| 5 | -1.239 | 1.296 | 0.056 | 0.459 | 0.001 |
| 10 | -1.241 | 1.299 | | | 0.001 |
| 20 | -1.242 | 1.301 | | | 0.002 |
| 30 | -1.245 | 1.306 | | | 0.002 |
| 45 | -1.249 | 1.313 | | | 0.003 |
| 60 | -1.253 | 1.320 | | | 0.004 |

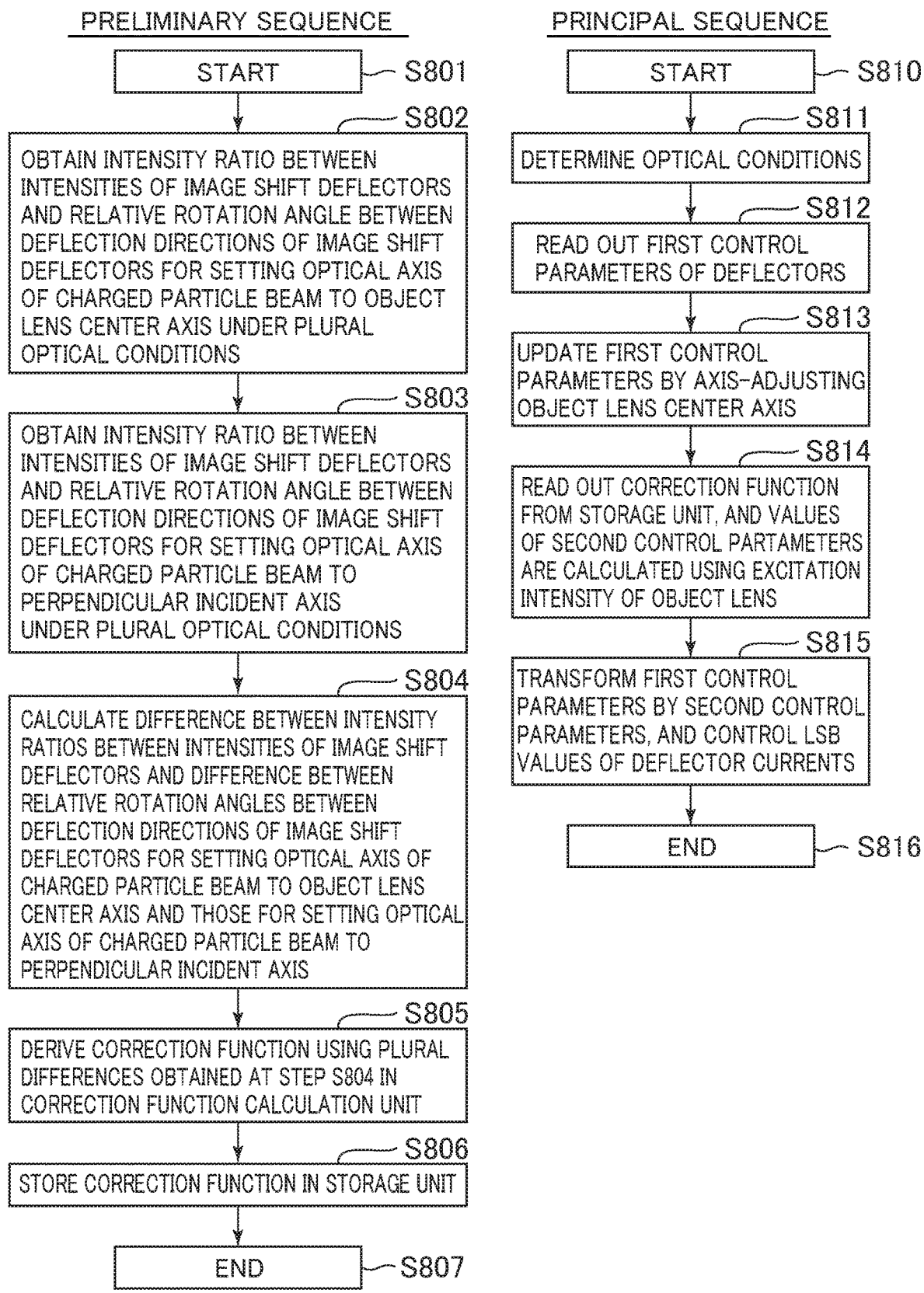

CHARGED PARTICLE BEAM APPARATUS

CROSS-REFERENCE TO RELATED APPLICATION

This application claims priority from Japanese Patent Application No. 2017-165432 filed on Aug. 30, 2017, the entire contents of which are incorporated by reference herein.

BACKGROUND

The present invention relates to charged particle beam apparatuses for measuring the dimensions of the microscopic pattern of a specimen, and in particular, relates to a charged particle beam apparatus that is equipped with a mechanism and a control method for controlling the gradient of a primary charged particle beam.

A scanning electron microscope (SEM), which is a type of a charged particle beam apparatus, accelerates primary electrons emitted from an electron source, converges the primary electrons using an electrostatic lens or an electromagnetic lens, and irradiates the primary electrons to the surface of a specimen. Secondary electrons are emitted from the specimen due to the irradiation of the primary electrons (in some cases, among the secondary electrons, electrons with low energy are referred to as "true" secondary electrons, and electrons with high energy are referred to as reflected electrons). Because the generation amount of secondary electrons becomes large at the edge portion of a pattern of the specimen, by scanning the surface of the specimen with primary electrons that are electromagnetically deflected, and by detecting secondary electrons emitted from some irradiation points of the surface of the specimen, a scanning electron microscope image (SEM image) that reflect the shape and composition distribution of the specimen is obtained. In addition, it is also possible to form an absorbed current image by detecting electrons absorbed in the specimen. Because the microscopic pattern of a specimen can be observed by locally converging primary electrons using an SEM in such a way, the SEM has been used for measuring the dimensions of microscopic patterns in semiconductor manufacturing processes.

In the case of using an SEM, if primary electrons are not deflected, the incident angles of the primary electrons into a specimen are almost perpendicular in many cases. On the other hand, if primary electrons are deflected, the incident angles of the primary electrons vary because the trajectories of the primary electrons change. If the incident angles vary, even if plural images of the same specimen pattern are obtained, the images of the plural images are viewed differently and the measurement values are also different from each other.

In recent years, the measurement of the dimensions of the bottom having three-dimensional structure has been increasingly needed in the measurement of the dimensions of semiconductor circuit patterns. In particular, the observation or dimension measurement of the bottom parts of deep grooves and deep holes having an aspect ratio of nearly 50 has been widely required. Furthermore, there is also a need for the measurement of a misalignment between the center of the upper surface of a deep groove or a deep hole and the center position of the bottom surface of the deep groove or the deep hole. In the measurement of a shape having such a high aspect ratio, the incident angles of primary electrons have a large effect on the measurement results. Therefore, in order to realize the high-accuracy measurement of a three-dimensional structure of a specimen typified by a deep groove or a deep hole, it is necessary to inject primary electrons perpendicularly into the specimen even in the case where the primary electrons are deflected.

To cope with this problem, a method in which the incident angles of primary electrons are set equal in a deflection region is disclosed in Japanese Unexamined Patent Application Publication 2007-187538, and a method in which the incident angles are controlled using a correction term is disclosed in Japanese Unexamined Patent Application Publication 2012-234754.

SUMMARY

In Japanese Unexamined Patent Application Publication 2007-187538, the incident angles of primary electrons are measured using a special pyramid pattern designed for the measurement of an incident angle, and a control table for a deflector used for controlling the changes of the incident angles for each optical condition is created, with the result that the changes of the incident angles due to the deflections of the primary electrons are suppressed. Because an adjustment value for each optical condition has to be used, and an incident angle has to be measured using a pyramid pattern for each optical condition, a considerable time is needed for the above job. In Japanese Unexamined Patent Application Publication 2012-234754, the plural images of the same mark of a specimen are shot with the relevant focal position changed plural times, and primary electrons are perpendicularly injected into the specimen on the basis of the position misalignment amount of the mark and the relevant correction coefficient. Correction coefficients are stored in a correction table for respective optical conditions. Therefore, a correction table for each optical condition has to be created as well as the control table for deflectors, which makes the control complicated.

Because the optical axis of a charged particle beam of a charged particle beam apparatus changes depending on the environments on the inside and outside of the apparatus, the adjustment of the incident angle of the charged particle beam has to be regularly executed. Accordingly, it is preferable that the changes of the incident angles of primary electrons using the deflection of the primary electrons can be easily adjusted.

A charged particle beam apparatus according to an aspect of the present invention include: a charged particle source for generating a charged particle beam; a specimen mounting table for mounting a specimen; a condenser lens and an object lens for converging the charged particle beam and irradiating the converged charged particle beam to the specimen; plural image shift deflectors for deflecting the charged particle beam; a control unit; and a storage unit. The storage unit stores first control parameters that set the optical axis of the charged particle beam to a first optical axis that passes the object lens center of the object lens and enters a predefined position of the specimen, and second control parameters that transform the first control parameters so that the first control parameters set the optical axis of the charged particle beam from the first optical axis to a second optical axis that enters the specimen with a predefined incident angle different from the incident angle of the first optical axis, and the control unit controls the deflection of the charged particle beam executed by the plurality of image shift deflectors using the first control parameters and the second control parameters.

Other problems and new characteristics of the present invention will be explicitly shown by the following descriptions of the present specification and the accompanying drawings.

A charged particle beam apparatus in which the incident angles of primary electrons can be easily adjusted by deflecting the primary electrons is provided.

BRIEF DESCRIPTION OF THE DRAWINGS

FIG. 3 is a table showing the differences between the control amounts of image shift deflectors of the object lens center axis and those of the perpendicular incident axis;

FIG. 4 is a table that is used for explaining incident angles obtained by the control by the image shift deflectors using several representative values;

FIG. 8 is a flowchart showing an adjustment sequence for setting the optical axis of a charged particle beam to the perpendicular incident axis using a correction function;

DETAILED DESCRIPTION

Hereinafter, embodiments for realizing the present invention will be described in detail with reference to the accompanying drawings. Although the embodiments 11 will be explained in the case of electrons being used as charged particles, the same advantageous effects will be obtained in the case of ions being used as charged particles.

First Embodiment

Figure 1:
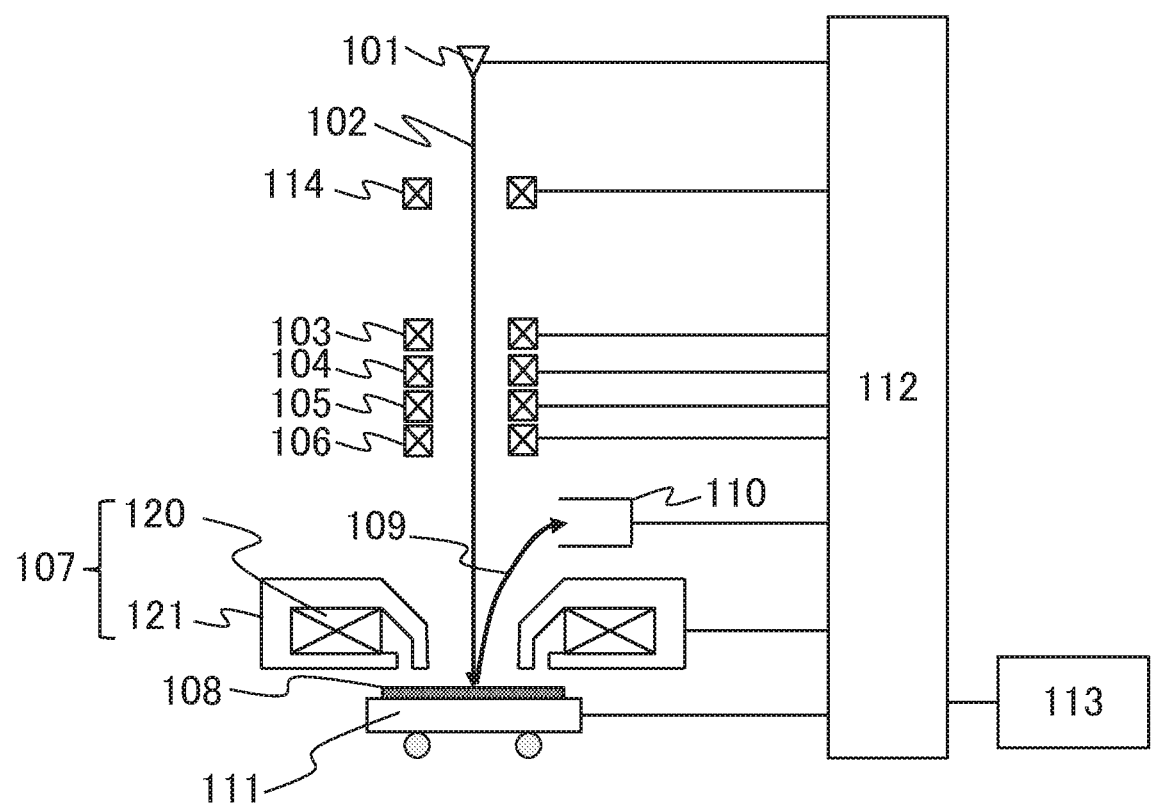
FIG. 1 is an overall block diagram of a scanning electron microscope according to a first embodiment.

FIG. 1 is an overall block diagram of a scanning electron microscope according to a first embodiment. Primary electrons 102 emitted from an electron source 101 are converged by a condenser lens 114, and after being deflected by an upper image shift deflector 103, an upper deflector 104, a lower image shift deflector 105, and a lower deflector 106, the primary electrons are condensed by an object lens 107 which is composed of an object lens coil 120 and an object lens magnetic path 121, and irradiated to a specimen 108. Secondary electrons 109 generated due to the irradiation of the primary electrons 102 to the specimen 108 are detected by a detector 110. The specimen 108 is held on a specimen mounting table 111, and the specimen mounting table 111 is configured to be movable in the horizontal and vertical directions with respect to the center axis of an electron optical system. In addition, the behaviors of the electron source 101, the condenser lens 114, the upper image shift deflector 103, the upper deflector 104, the lower image shift deflector 105, the lower deflector 106, the detector 110, the object lens 107, and the specimen mounting table 111 are controlled by a control unit 112. A storage unit 113 stores parameters for controlling these components of the scanning electron microscope, and the control unit 112 reads out these parameters stored in the storage unit 113, and performs control on these components.

An observation region of the specimen 108 is two-dimensionally scanned with the primary electrons 102 to obtain an image. Such a two-dimensional scanning is performed by the upper deflector 104 and the lower deflector 106. On the other hand, the shift of the visual field about ±10 μm is executed by the upper image shift deflector 103 and the lower image shift deflector 105. Although the shift of the visual field can also be executed by the specimen mounting table 111, because the behavior of the specimen mounting table 111 is a mechanical movement, it is difficult for the specimen mounting table 111 to move at high speed, and the accuracy of the shift of the visual field by the specimen mounting table 111 is low. Although an image shift executed by the upper image shift deflector 103 and the lower image shift deflector 105 cannot provide a large shift mount, if a required shift amount is about ±10 μm, the upper image shift deflector 103 and the lower image shift deflector 105 can provide the required shift amount more quickly and more accurately than the specimen mounting table 111.

Figure 2A:
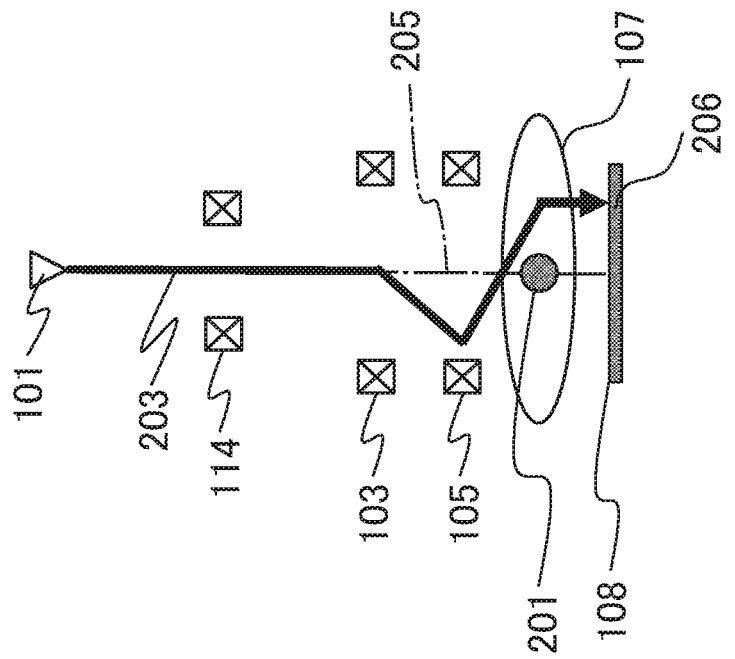
FIG. 2A is a diagram showing the trajectory of primary electrons (object lens center axis) due to image shift deflection.

FIG. 2A shows the trajectory 202 of primary electrons (hereinafter, referred to as the "object lens center axis") subject to a normal image shift deflection. The primary electrons deflected by the upper image shift deflector 103 and the lower image shift deflector 105 pass through the object lens center 201, and enter the visual field center 206 of the specimen 108. The visual field center 206 is located at a position different from an intersection point of the central axis 205 of the electron optical system and the specimen 108. Here, the "object lens center" means the intersection point of the principal surface of the object lens 107 and the central axis 205 of the electron optical system. Because the primary electrons enter the object lens center 201 with an angle with respect to the central axis 205, the incident angle of the primary electrons into the specimen 108 change in accordance with the deflection amount caused by the image shift deflectors. Therefore, in the observation, measurement, and the like of deep holes and deep grooves having high aspect ratios, the variation of this incident angle is not negligible.

Figure 2B:
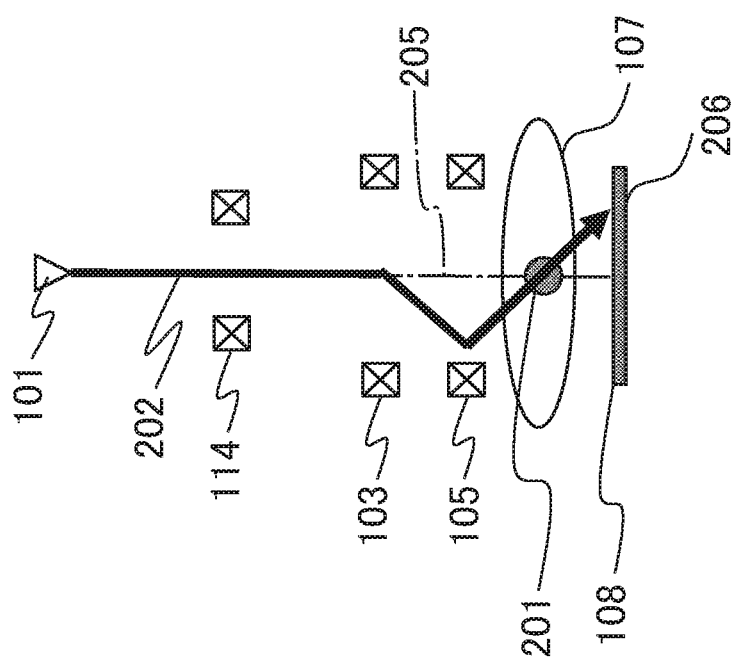
FIG. 2B is a diagram showing the trajectory of primary electrons (perpendicular incident axis) due to image shift deflection.

FIG. 2B is a diagram showing the trajectory 203 of primary electrons (hereinafter, referred to as the perpendicular incident axis) caused by perpendicular incident image shift deflection. Because the primary electrons enter the surface of the specimen 108 at right angle along the perpendicular incident axis 203, this trajectory of the primary electrons is suitable for the observation, measurement, and the like of deep holes and deep grooves having high aspects. By making the perpendicular incident axis 203 pass through the outside of the object lens 201, the perpendicular entry of the primary electrons into the surface of the specimen 108 is realized by the deflection operation of the upper image shift deflector 103, the lower image shift deflector 105, the object lens 107. Here, because the object lens 107 is a magnetic field lens and exerts rotation movement on the primary electrons 102, not only the deflection intensities but the deflection directions of the upper image shift deflector 103 and the lower image shift deflector 105 have to be changed so as to have appropriate values.

The inventors of the present invention keenly examined a control method for realizing the perpendicular incident image shift deflection shown in FIG. 2B, and found out that, under the condition that a deceleration method is not applied to the specimen 108, that is to say, for example, under the condition that a negative polarity retarding voltage is effectively not applied to the specimen 108, the control amounts applied to the image shift deflectors in order for the optical axis of a charged particle beam to transfer from the object lens center axis 202 (FIG. 2A) to the perpendicular incident axis 203 (FIG. 2B) change little in accordance with the changes of the optical conditions typified by an acceleration voltage. This means that the perpendicular incident image shift deflection can be realized by a vastly-simplified control method.

In the case where the deceleration method is applied, for example, in the retarding method, primary electrons are decelerated in the vicinity of the object lens 107 by applying a negative polarity retarding voltage to the specimen 108. In this case, the object lens 107 functions as an electromagnetic field superimposing lens the electromagnetic field of which is composed of a magnetic field formed by the object lens coil 120 and the object lens magnetic path 121 and an electrostatic field formed by the retarding voltage. Therefore, if an acceleration voltage, which is one of main optical conditions, changes, the magnitude of the electrostatic field greatly changes, so that the position of the lens principal surface of the object lens 107 moves. Therefore, control performed by the image shift deflectors in this embodiment cannot be applied to an electron optical system to which the deceleration method is applied.

FIG. 3 is Table 301 that shows differences between control amounts used for setting the optical axis of the charged particle beam to the object lens center axis 202 and control amounts used for setting the optical axis of the charged particle beam to the perpendicular incident axis 203 by respectively applying different acceleration voltages to the same visual field center 206. In the scanning electron microscope according to this embodiment, the deflection amounts of primary electrons that enter the object lens 107 can be controlled with the use of an intensity ratio of the intensity of the upper image shift deflector 103 to the intensity of the lower image shift deflector 105, and a relative rotation angle between the deflection directions of the upper image shift deflector 103 and the lower image shift deflector 105. Table 301 shows the differences between the control amounts of image shift deflectors used for setting the optical axis of the charged particle beam to the object lens center axis 202 and those used for setting the optical axis of the charged particle beam to the perpendicular incident axis 203 as differences between two parameters. Two parameters are the intensity ratio of the intensity of the upper image shift deflector 103 to the intensity of the lower image shift deflector 105, and the relative rotation angle between the deflection directions of the upper image shift deflector 103 and the lower image shift deflector 105.

Judging from Table 301, it is understandable that a difference between the intensity ratio of the intensity of the upper image shift deflector 103 to the intensity of the lower image shift deflector 105 in the case of the object lens center axis and that in the case of the perpendicular incident axis and a difference between the relative rotation angle between the deflection directions of the upper image shift deflector 103 and the lower image shift deflector 105 in the case of the object lens center axis and that in the case of the perpendicular incident axis change little or nothing even if the acceleration voltage is changed. This means that, if the image shift deflectors are once controlled so that the optical axis of the charged particle beam is set to the object lens center axis, there is a possibility that the optical axis of the charged particle beam is transferred from the object lens center axis to the perpendicular incident axis by controlling the image shift deflectors on the basis of representative values of the differences shown in FIG. 3 regardless of a current acceleration voltage to be applied afterward.

FIG. 4 shows the calculated results of incident angles in the case of controlling the image shift deflectors using the representative values of the differences in Table 401. FIG. 3 and FIG. 4 show the control amounts of the image shift deflectors under the same conditions. The column 402 shows the control amounts of the image shift deflectors for setting the optical axis of the charged particle beam to the object lens center axis 202, and the column 403 shows the representative values of differences (FIG. 3) between the control amounts of the image shift deflectors for setting the optical axis of the charged particle beam to the object lens center axis 202, and the control amounts of the image shift deflectors for setting the optical axis of the charged particle beam to the perpendicular incident axis 203. The column 404 shows the incident angles of primary electrons on the basis of the representative values of the differences (the column 403). Here, simple average values are used as the representative values.

As shown in the column 404, incident angles obtained by control using the representative values of differences are equal to 0.01° or smaller. Even in the case of a high aspect-ratio shape having a high aspect ratio 50, the prospective angle of the shape is 0.57°, therefore incident angles obtained by control using the representative values are substantially small in comparison with the prospective angle of the high aspect-ratio shape that is a measurement target. On the basis of the above knowledge, in this embodiment, differences between the control amounts of the image shift deflectors for setting the optical axis of the charged particle beam to the object lens center axis and the control amounts of the image shift deflectors for setting the optical axis of the charged particle beam to the perpendicular incident axis are calculated in advance under plural optical conditions, and the representative values of the differences are stored. At the time of the observation or measurement, first the control amounts of the image shift deflectors for setting the optical axis of the charged particle beam to the object lens center axis is calculated, and the optical axis of the charged particle beam is set to the perpendicular incident axis by adding control based on the representative values of the differences to the above control amounts.

The control amounts for setting the optical axis of the charged particle beam to the object lens center axis 202 are given by Expression 1 using first control parameters (A, B, C, D).

[Expression 1]

$$\begin{pmatrix} ISM2X \\ ISM2Y \end{pmatrix} = \begin{pmatrix} A & B \\ C & D \end{pmatrix} \begin{pmatrix} ISM1X \\ ISM1Y \end{pmatrix} \qquad \text{(数1)}$$

(Expression 1)

In Expression 1, ISM1X and ISM1Y are LSB (least significant bit) values applied to the upper image shift deflector 103, and ISM2x and ISM2Y are LSB values applied to the lower image shift deflector 105. Current amounts flowing through the respective image shift deflectors are controlled by these LSB values. Here, the first control parameters in Expression 1 can be expressed by Expression 2 using an intensity ratio $\alpha_0$ of the intensity of the upper image shift deflector 103 to the intensity of the lower image shift deflector 105 and a relative rotation angle $\theta_0$ between the deflection directions of the upper image shift deflector 103 and the lower image shift deflector 105 in the case of the optical axis of the charged particle beam being set to the object lens center axis 202.

[Expression 2]

$$\begin{pmatrix} A & B \\ C & D \end{pmatrix} = \begin{pmatrix} \cos\theta_0 & -\sin\theta_0 \\ \sin\theta_0 & \cos\theta_0 \end{pmatrix} \begin{pmatrix} 1+\alpha_0 & 0 \\ 0 & 1+c_0 \end{pmatrix} \quad \text{(Expression 2)}$$

To put it concretely, the intensity ratio $\alpha_0$ and the relative rotation angle $\theta_0$ between the deflection directions become values shown in the column 402 in FIG. 4 under a predefined optical condition. Control based on the differences (representative values) is performed for transferring the optical axis of the charged particle beam from the object lens center axis 202 to the perpendicular incident axis 203. The control amounts of the image shift deflectors for setting the optical axis of the charged particle beam to the perpendicular incident axis 203 are given by Expression 3 using second control parameters (a, b, c, d).

[Expression 3]

$$\begin{pmatrix} ISM2X \\ ISM2Y \end{pmatrix} = \begin{pmatrix} a & b \\ c & d \end{pmatrix} \begin{pmatrix} A & B \\ C & D \end{pmatrix} \begin{pmatrix} ISM1X \\ ISM1Y \end{pmatrix} \quad \text{(Expression 3)}$$

Here, the second control parameters of Expression 3 are given by Expression 4 using the representative value $\Delta\alpha$ of differences between the intensity ratios of the intensities of the upper image shift deflector 103 to the intensities of the lower image shift deflector 105 in the case of the object lens center axis and those in the case of the perpendicular incident axis, and the representative value $\Delta\theta$ of differences between the relative rotation angles between the deflection directions of the upper image shift deflector 103 and the deflection directions of the lower image shift deflector 105 in the case of the object lens center axis and those in the case of the perpendicular incident axis.

[Expression 4]

$$\begin{pmatrix} a & b \\ c & d \end{pmatrix} = \begin{pmatrix} \cos\Delta\theta & -\sin\Delta\theta \\ \sin\Delta\theta & \cos\Delta\theta \end{pmatrix} \begin{pmatrix} 1+\Delta\alpha & 0 \\ 0 & 1+\Delta\alpha \end{pmatrix} \quad \text{(Expression 4)}$$

To put it concretely, the representative value $\Delta\alpha$ of the differences between the intensity ratios and the representative value $\Delta\theta$ of the differences between the relative rotation angles between the deflection directions become values shown in the column 403 in FIG. 4. Therefore, as the second parameters to be stored in the storage unit 113 of the scanning electron microscope, the representative value $\Delta\alpha$ of the differences between the intensity ratios of the intensities of the upper image shift deflector 103 to the intensities of the lower image shift deflector 105 and the representative value $\Delta\theta$ of the differences between the relative rotation angles between the deflection directions of the upper image shift deflector 103 and the lower image shift deflector 105 can be stored, or the values of (a, b, c, d) can be stored instead. In this case, a, b, c, and d are given by the following expressions.

$a=(1+\Delta\alpha)\cos\Delta\theta$ $b=-(1+\Delta\alpha)\sin\Delta\theta$ $c=(1+\Delta\alpha)\sin\Delta\theta$ $d=(1+\Delta\alpha)\cos\Delta\theta$ Here, Expression 3 shows control that makes the optical axis of the charged particle beam set to the perpendicular incident angle by adjusting the LSB values (ISM2X and ISM2Y) of currents applied to the lower image shift deflector 105 on the basis of the LSB values (ISM1X and ISM1Y) of currents applied to the upper image shift deflector 103. On the contrary, it is also possible to adjust the LSB values (ISM1X and ISM1Y) of the currents applied to the upper image shift deflector 103 on the basis of the LSB values (ISM2X and ISM2Y) of the currents applied to the lower image shift deflector 105.

The first control parameters for setting the optical axis of the charged particle beam to the object lens center axis depends on the optical conditions of the electron optical system. However, because there are not many restrictions regarding the pattern of a specimen in the case of the object lens center axis, the object lens center axis 107 can be adjusted using a common axis adjustment technique such as a wobbling of the excitation intensity of an object lens 107, for example. By fixing the second control parameters regardless of the optical conditions, it becomes possible to measure the specimen in a short time.

Next, an adjustment sequence for setting the optical axis of the charged particle beam to the perpendicular incident axis will be explained with reference to FIG. 5. This adjustment sequence is composed of a preliminary sequence and a principal sequence. The preliminary sequence is mainly executed before the shipment of the apparatus, or at the time of the installation of the apparatus, and the principal sequence is executed at the time when an operator uses the apparatus after the delivery of the apparatus.

First, the preliminary sequence will be explained. At step S502, an intensity ratio of the intensity of the upper image shift deflector 103 to the intensity of the lower image shift deflector 105 and a relative rotation angle between the deflection directions of the upper image shift deflector 103 and the lower image shift deflector 105 in the case of setting the optical axis of the charged particle beam to the object lens center axis are obtained under plural optical conditions, for example, under plural acceleration voltages and modes. Subsequently, at step S503, an intensity ratio of the intensity of the upper image shift deflector 103 to the intensity of the lower image shift deflector 105 and a relative rotation angle between the deflection directions of the upper image shift deflector 103 and the lower image shift deflector 105 in the case of setting the optical axis of the charged particle beam to the perpendicular incident axis are obtained under the same optical conditions as at step S502. At step S504, a difference between the intensity ratios of the intensities of the upper image shift deflector 103 to the intensities of the lower image shift deflector 105 and a difference between the relative rotation angles between the deflection directions of the upper image shift deflector 103 and the lower image shift deflector 105 obtained at step S502 and those obtained at step S503 are calculated for each optical condition. At step S505, representative values are calculated from the difference values obtained at step S504. In this case, as a calculation method of the representative values, a method by which average values or median values are obtained can be used, or other statistical methods can be used. As shown in FIG. 4, because the incident angle of the perpendicular incident axis realized by the control of this embodiment has substantially small values, the differences among the values of the incident angle obtained by different calculation methods of the representative value are kept down at negligible levels. Lastly, at step S506, the representative values obtained at step S505 are stored in the storage unit 113 as the second control parameters.

Next, the principal sequence will be explained. At step S511, an operator sets optical conditions. At step S512, the intensity ratio of the intensity of the upper image shift deflector 103 to the intensity of the lower image shift deflector 105 and the relative rotation angle between the deflection directions of the upper image shift deflector 103 and the lower image shift deflector 105 at the object lens center axis, that is to say, the first parameters are readout from the storage unit 113. At step S513, the first control parameters are updated by the axis adjustment of the object lens center axis. For example, the first control parameters are updated using adjustment values obtained when the optical axis is adjusted so that the shift of an image does not occur when the focal length of the lens is periodically varied by a wobbler. At step S514, the second parameters obtained in the preliminary sequence are read out from the storage unit 113. At step S515, as shown by the above-described Expression 3, the first control parameters are transformed by the second control parameters, and current amounts to be applied to the upper image shift deflector 103 and the lower image shift deflector 105 are calculated.

Control of the perpendicular incident axis can be realized through the above sequences. Here, it is not always necessary that the optical conditions (steps S502 and S503) used for the adjustments in the preliminary sequence should include all optical conditions possessed by the apparatus, that is to say, all optical conditions that an operator can select in the principal sequence. For example, even if acceleration voltages that are not used for calculating the representative values in the preliminary sequence are used as acceleration voltages in the principal sequence, the perpendicular incident axis can be obtained.

Furthermore, the optical conditions include not only acceleration voltages cited as examples, but also a mode (for example, a resolution priority mode, or a focal depth priority mode) can be selected as an optical condition. To put it concretely, although switching between the modes such as the resolution priority mode and the focal depth priority mode is executed by changing the excitation amount of the condenser lens 114 so that the position of the object point (object surface) of primary electrons 102 is changed, the optical axis of the charged particle beam can be set to the perpendicular incident axis by applying the representative value control of this embodiment regardless of what mode may be selected.

In addition, a trajectory realized by the representative value control is not limited to the perpendicular incident axis, and it is also possible to form a trajectory having a desired incident angle using the representative value control.

In this case, the control amounts for the upper image shift deflector 103 and the lower image shift deflector 105 are given by Expression 5.

[Expression 5]

$$\begin{pmatrix} ISM2X \\ ISM2Y \end{pmatrix} = \begin{pmatrix} a & b \\ c & d \end{pmatrix} \begin{pmatrix} A & B \\ C & D \end{pmatrix} \begin{pmatrix} ISM1X \\ ISM1Y \end{pmatrix} + \begin{pmatrix} e \\ f \end{pmatrix} \quad \text{(数 5)} \quad \text{(Expression 5)}$$

In other words, offset currents represented by a vector term (e, f) are added to the upper image shift deflector 103 and the lower image shift deflector 105 respectively. In such a way, by adding an offset vector term (e, f) obtained in advance by measurement to the second control parameters, it becomes possible to realize a trajectory having a desired incident angle. With this, even in the case where the side surface of a deep hole or a deep groove is slanting, measurement in an etching process, for example, can be flexibly performed.

This embodiment can be applied to a system other than an electron optical system in which the position of the principal surface of an object lens is greatly changed, for example, an electron optical system to which a deceleration method is applied. Furthermore, this embodiment can be applied to a system to which a retarding method is applied if the retarding conditions are such weak retarding conditions as include a high-acceleration region with an acceleration voltage 5 kV or larger and a negative voltage about −100 V applied to the specimen 108. This is because, even if the retarding method is applied to the system, the shift of the principal surface associated with the changes of the retarding conditions is small. In addition, although the adjustment of the object lens center axis is executed first in this embodiment, even if the trajectory is misaligned with the object lens center, it goes without saying that the misalignment is acceptable if the misalignment is practically no problem. Furthermore, it is also conceivable that this embodiment includes three stages of deflectors, and control parameters used in this embodiment can be represented in various forms.

Second Embodiment

Figure 6:
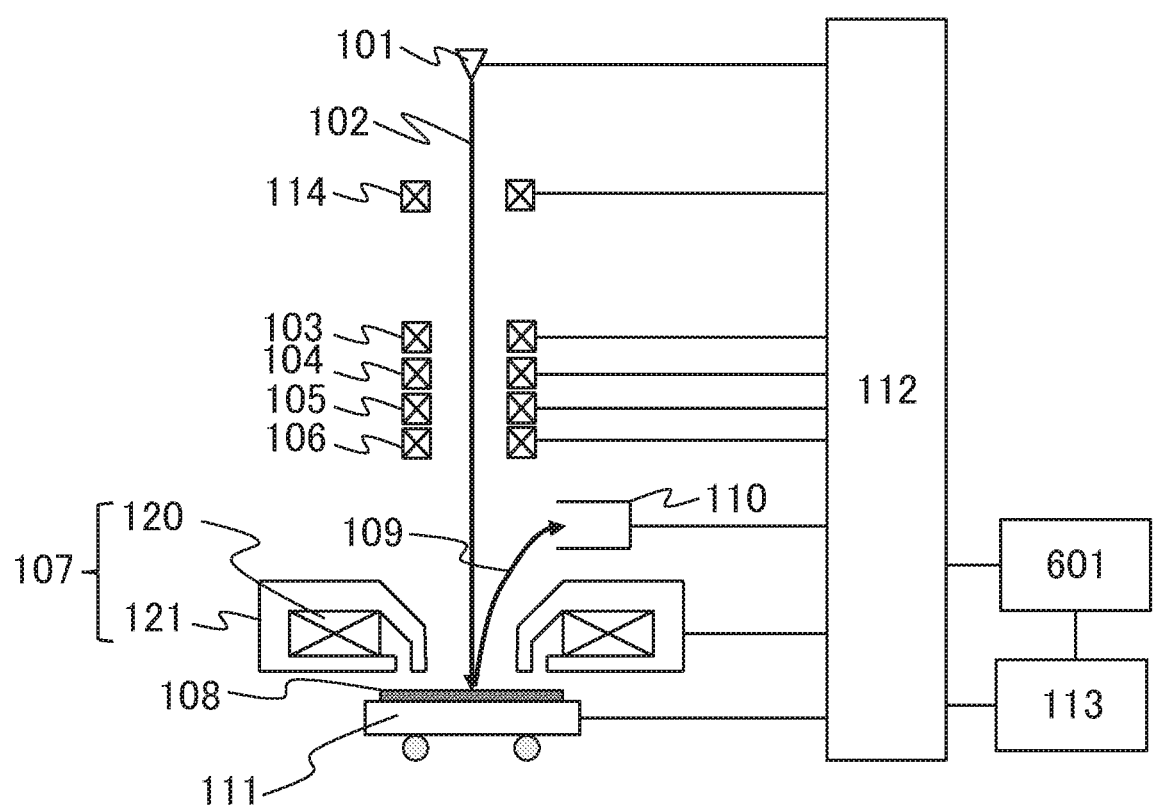
FIG. 6 is an overall block diagram of a scanning electron microscope according to a second embodiment.

In the first embodiment, the control using which the optical axis of the charged particle beam is set to the perpendicular incident axis using the representative values (fixed values) has been explained. In a second embodiment, control using a correction function will be explained. Due to this correction function, the control can be performed more accurately. FIG. 6 is an overall block diagram of a scanning electron microscope according to the second embodiment, and this overall block diagram has a configuration obtained by adding a correction function calculation unit 601 to the overall block diagram shown in FIG. 1.

Figure 7B:
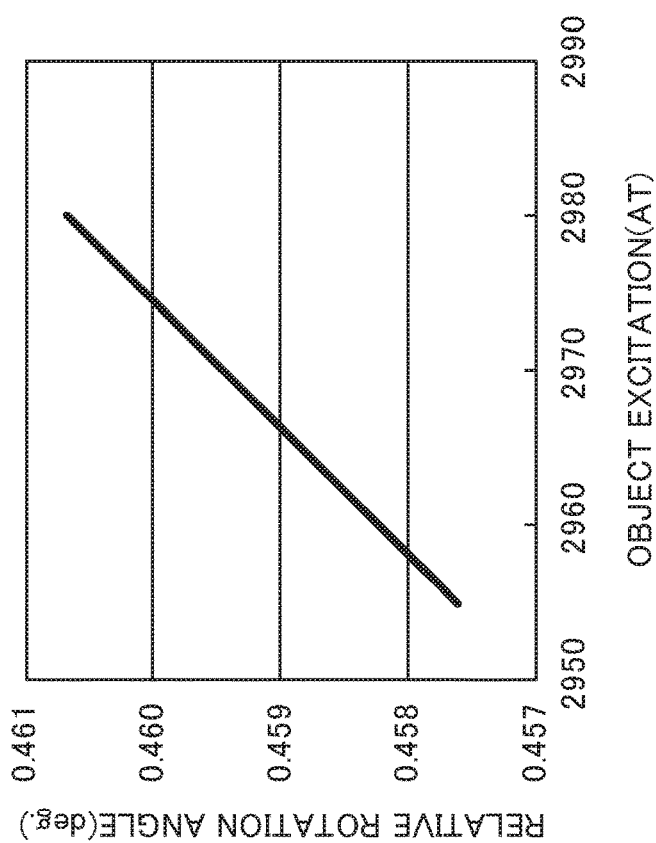
FIG. 7B is a diagram explaining the object excitation dependency of the difference between relative rotation angles between deflection directions.
Figure 7A:
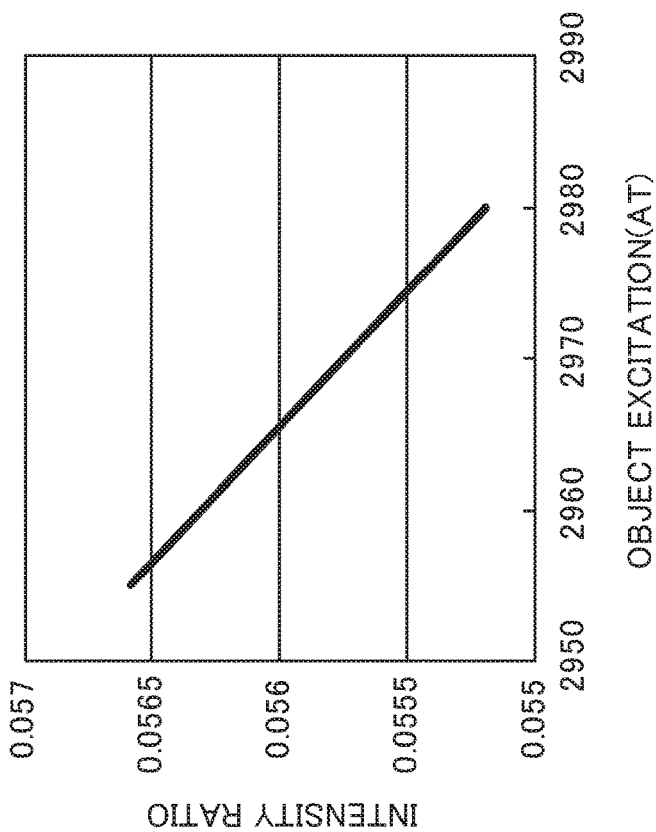
FIG. 7A is a diagram explaining the object excitation dependency of a difference between intensity ratios.

Although the fact that the correction amounts necessary for generating the perpendicular incident axis are almost the same even if the optical conditions are different has been described with reference to FIG. 3, these correction amounts are not perfectly the same. FIG. 7A and FIG. 7B shows how the control amounts of the image shift deflectors needed for transfer from the object lens center axis to the perpendicular incident axis change in accordance with the excitation intensity of the object lens under predefined optical conditions. FIG. 7A shows a difference between an intensity ratio of the intensity of the upper image shift deflector 103 to the intensity of the lower image shift deflector 105 in the case of the object lens center axis and that in the case of the perpendicular incident axis, and FIG. 7B shows a difference between a relative rotation angle between the deflection directions of the upper image shift deflector 103 and the lower image shift deflector 105 in the case of the object lens center axis and that in the case of the perpendicular incident axis. As shown by these graphs, it is understandable that an intensity ratio of the intensity of the upper image shift deflector 103 to the intensity of the lower image shift deflector 105 and the relative rotation angle between the deflection directions of the upper image shift deflector 103 and the lower image shift deflector 105 can be corrected by using an appropriate function corresponding to an excitation intensity. Here, such a change of the excitation intensity is generated when the focal position is changed in accordance with the height of a specimen to be observed or when the position of the object point of the primary electrons 102 is changed by controlling the excitation intensity of the condenser lens 114.

An adjustment sequence for setting the optical axis of a charged particle beam to the perpendicular incident axis using the correction function will be explained with reference to FIG. 8. Main differences between the adjustment sequence shown in FIG. 8 and the adjustment sequence shown in FIG. 5 are step S805 and step S814. At step S805 in a preliminary sequence in FIG. 8, the correction function is derived in the correction function calculation unit 601 using difference values obtained at step S804. The correction function is a function such as a polynominal expression or an exponential function, and the correction function is designated by an apparatus designer. Each coefficient of the correction function is derived using, for example, a least-squares method. At step S806, the derived correction function is stored in the storage unit 113 as second control parameters. At step S814 in a principal sequence, the values of the second control parameters are calculated using the excitation intensity of the object lens 107 and the correction function.

Figure 5:
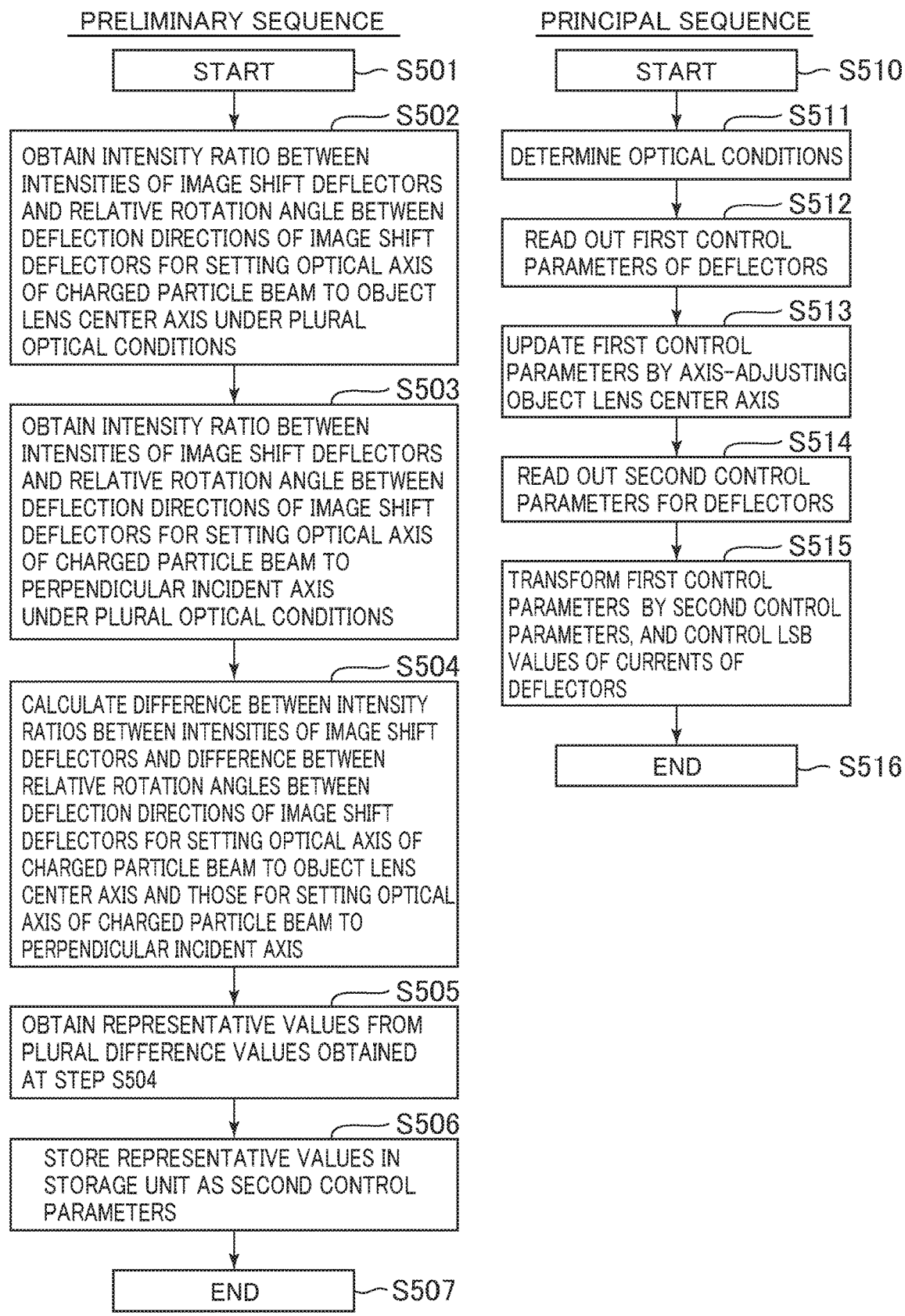
FIG. 5 is a flowchart showing an adjustment sequence for setting the optical axis of a charged particle beam to the perpendicular incident axis using the representative values.

In the preliminary sequence in FIG. 8, as is the case with FIG. 5, it is not always necessary to execute the preliminary sequence under all optical conditions that an operator can select. In addition, because the correction function is used in this embodiment, an incident angle that is more perpendicular than the incident angle obtained in the first embodiment can be obtained.

In addition, although the correction function, which is used for calculating the differences using the excitation intensity of the object lens 107 as a variable, has been explained so far as an example, other parameters can be used as variables. For example, the position of the object point of the primary electrons 102 can be set to a variable.

Third Embodiment

In the case of the perpendicular incident axis, if the excitation intensity of the object lens 107 is changed, the center position of the visual field is moved. This is because, in the case of the perpendicular incident axis 203, primary electrons do not pass through the object lens center 201 of the object lens 107. On the other hand, in the case of the object lens center axis 202, primary electrons pass through the object lens center 201 of the object lens 107, therefore the center position of the visual field is not moved even if the excitation intensity of the object lens 107 is changed. A phenomenon like this in which the position of the primary electrons is moved in the case of the perpendicular incident axis becomes problematic when an operation accompanied by the change of the excitation intensity of the object lens 107 is executed, for example, when the adjustment of the focus of an image is executed. Therefore, when focus correction in the case of the perpendicular incident axis is executed in this embodiment, the focus correction is executed in the state of the object lens center axis first, and then, after the incident position of the primary electrons is adjusted so that the shift amount of the visual filed is canceled, the control parameters of the deflectors are changed so that the optical axis of a charged particle beam becomes the perpendicular incident axis. If the shift amounts of the beam position caused by changing the control parameters of the deflectors are measured in advance, these data can be used for feedback.

Figure 9:
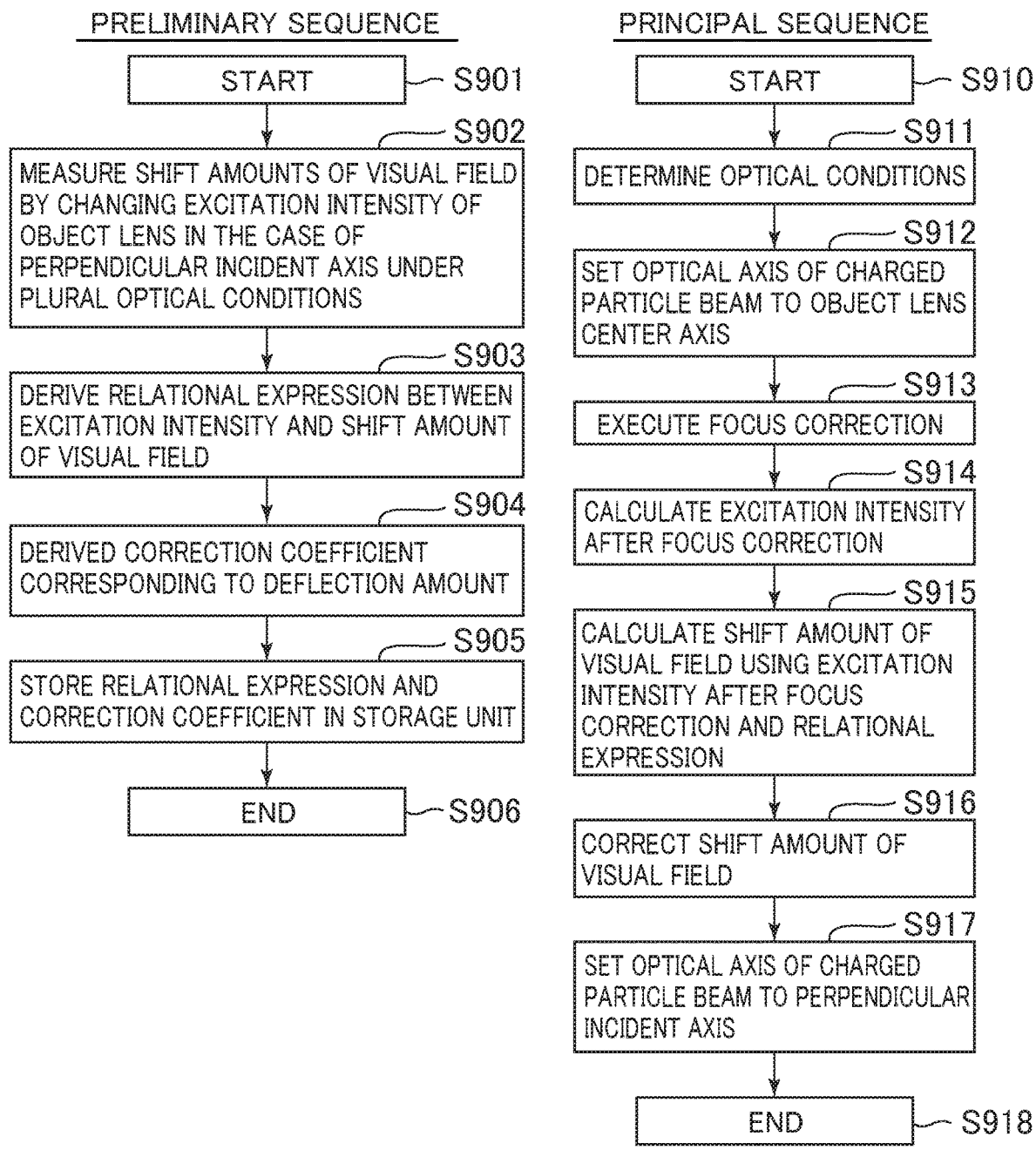
FIG. 9 is a diagram showing an adjustment sequence for realizing a focus correction that cancels the shift of a visual field.

An adjustment sequence for realizing focus correction that does not generates the shift of the visual field will be explained with reference to FIG. 9. Here, the shift amount of the visual field is the shift amount of the center of the visual field generated at the time when the optical axis of the charged particle beam is transferred from the object lens center axis to the perpendicular incident axis. This adjustment sequence is composed of a preliminary sequence and a principal sequence.

First, the preliminary sequence will be explained. At step S902, the shift amounts of the visual field are measured by changing the excitation intensity of the object lens 107 in the case of the perpendicular incident axis under plural optical conditions, for example, under plural acceleration voltages. At step S903, a relational expression between the excitation intensity and the shift amount of the visual field (shift amount of visual field=coefficient×excitation current variation) is derived. Furthermore, the shift amount of the visual field also depends on a deflection amount (a distance from the central axis 205 to the center position of the visual field) that is given by the deflectors to deflect primary electrons 102. In order to improve the control accuracy, a correction coefficient for correcting the shift amount of the visual field corresponding to the deflection amount is derived at step S904. At step S905, the relational expression obtained at step S903 and the correction coefficient obtained at step S904 are stored in the storage unit 113.

Next, the principal sequence will be explained. At step S911, an operator sets optical conditions. After the optical axis of the charged particle beam is set to the object lens center axis at step S912, a focus correction is executed at step S913. At step S914, excitation intensity after the focus correction is calculated. At step S915, the value of the excitation intensity calculated at step S914 is substituted into the relational expression obtained in the preliminary sequence to calculate the value of the shift amount of the visual field. At step S916, the shift amount of the visual field, which is developed by transferring the optical axis of the charged particle beam from the object lens center axis to the perpendicular incident axis, is corrected so that the shift amount of the visual field is canceled. At this time, because the shift amount of the visual field also depends on the deflection position, the shift amount of the visual field, which is calculated at step S916, is corrected using the correction coefficient corresponding to the deflection amount. At step S917, the optical axis of the charged particle beam is set to the perpendicular incident axis. To put it concretely, the second control parameters are applied to the first control parameters that set the optical axis of the charged particle beam to the object lens center axis whose shift amount of the visual field is corrected. The above-described sequences make it possible to realize the focus correction free of the shift of the visual field. Furthermore, because the shift amount of the visual field is corrected using the correction coefficient, feedback corresponding to the deflection amount can be executed.

Figure 10:
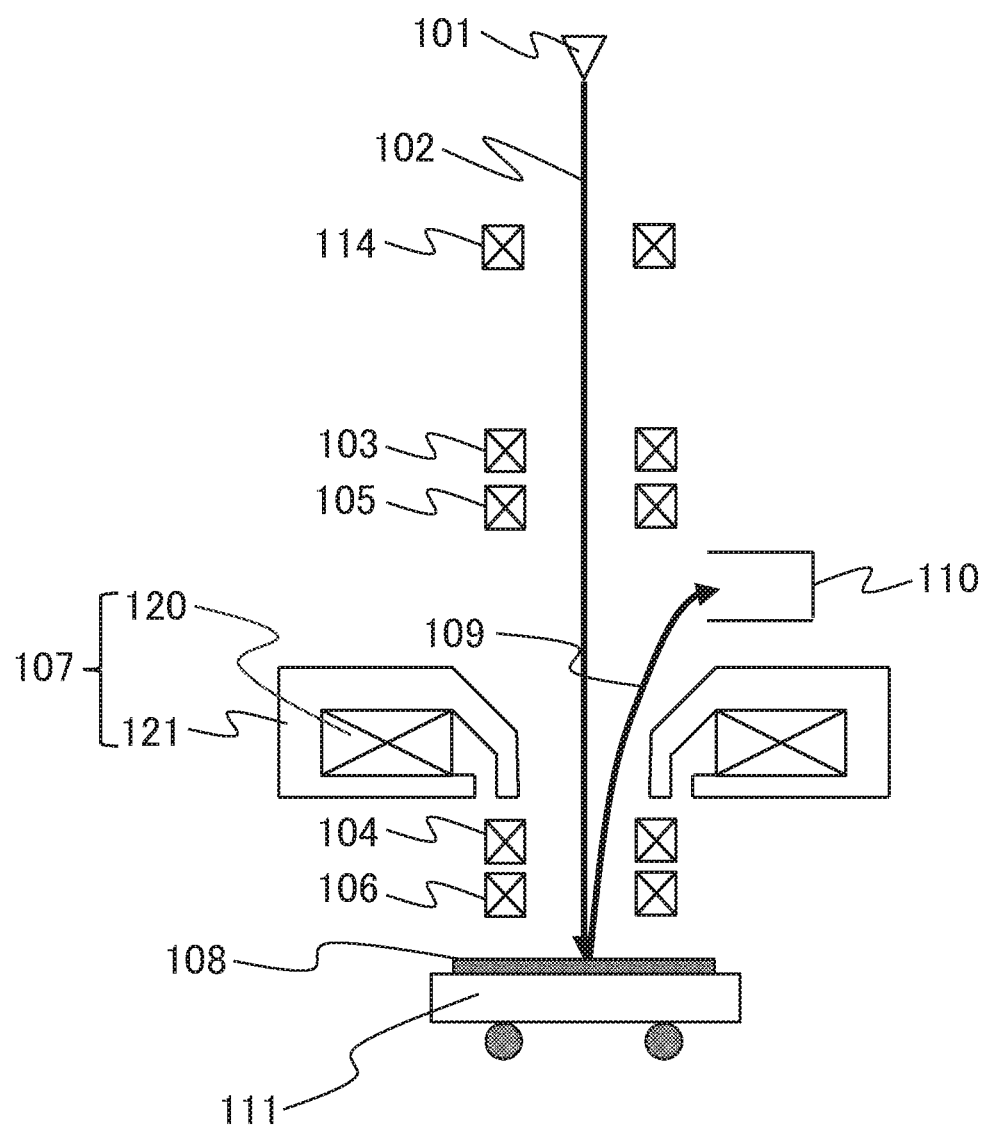
FIG. 10 is a diagram showing the configuration of the optical system of a scanning electron microscope.

Although the configurations of electron optical systems of scanning electron microscopes used in the above-described embodiments are shown in FIG. 1 and FIG. 6, the present invention is not limited to these configurations. For example, although the image shift deflectors 103 and 105 used for the shift of the visual field, and the deflectors 104 and 106 used for photographing are installed between the electron source 101 and the object lens 107 in the configuration shown in FIG. 1 or FIG. 6, the locations of the deflectors 104 and 106 are not limited to the locations shown in FIG. 1 or FIG. 6. As shown in FIG. 10, it is conceivable that the upper deflector 104 and the lower deflector 106 are installed in such a way that both deflectors are sandwiched between the object lens 107 and the specimen 108 or the specimen mounting table 111. In the configuration of an electron optical system where the deflectors 104 and 106, which are used for photographing, are installed between the electron source 101 and the object lens 107, there is an advantageous effect that the distance between the object lens 107 and the specimen 108 can be easily shortened. On the other hand, the deflectors 104 and 106, which are used for photographing, are installed between the object lens 107 and the specimen 108, there is an advantageous effect that a wide visual field can be secured. Here, it is not always required that the number of deflectors used for photographing should be two, and the number can be one or three or more.

Figure 11:
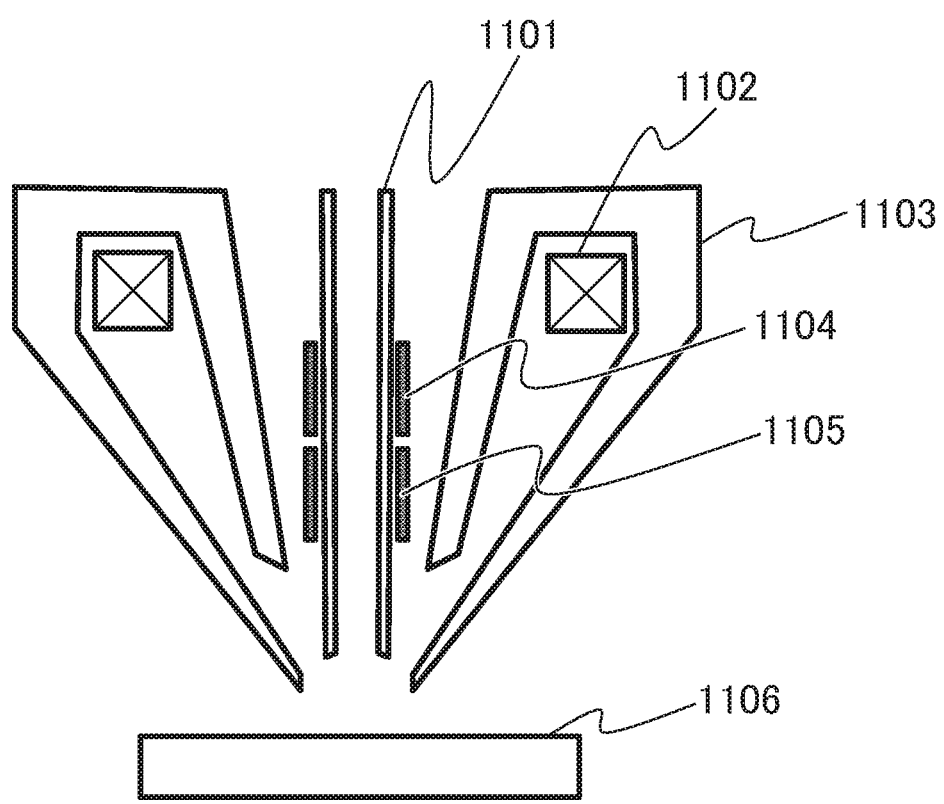
FIG. 11 is a diagram showing the configuration of an object lens.

In addition, the structure of an object lens is not limited to any of the above-described structures. For example, an object lens shown in FIG. 11 provides an image on a specimen 1106 with an electron beam using an electromagnetic lens, which includes an object lens magnetic path 1103 and an object lens coil 1102, and an electrode 1101. In the object lens shown in FIG. 11, the openings of the magnetic paths of the electromagnetic lens look toward the optical axis of the electron beam, that is to say, the object lens is an out-lens type object lens, and not a semi-in-lens type object lens shown in FIG. 1. The present invention can be applied to even such a type of object lens. In particular, the out-lens type object lens is characterized in that the shift of the principal surface of its own corresponding to the height of a specimen is practically negligible. This fact greatly contributes to the enhancement of the robustness of each of the first to third embodiments against the variation of the height of a specimen in the implementation of each of the first to third embodiments. Furthermore, in the configuration shown in FIG. 11, two deflectors (the upper image shift deflector 1104 and the lower image shift deflector 1105) are located on the opposite side of the specimen 1106 with the openings of the magnetic paths of the object lens sandwiched between themselves and the specimen 1106. In this case, by applying the controls of the first to third embodiments to the two deflectors 1104 and 1105, it becomes possible to generate deflection for setting the optical axis of the charged particle beam to the perpendicular incident axis.

What is claimed is:

1. A charged particle beam apparatus comprising:
   a charged particle source for generating a charged particle beam;
   a specimen mounting table for mounting a specimen;
   a condenser lens and an object lens for converging the charged particle beam and irradiating the converged charged particle beam to the specimen;
   a plurality of image shift deflectors for deflecting the charged particle beam;
   a control unit; and
   a storage unit,
   wherein the storage unit stores first control parameters that set the optical axis of a charged particle beam to a first optical axis that passes the object lens center of the object lens and enters a predefined position of the specimen, and second control parameters that transform the first control parameters so that the first control parameters set the optical axis of the charged particle beam from the first optical axis to a second optical axis that enters the specimen with a predefined incident angle different from the incident angle of the first optical axis, and
   the control unit controls the deflection of the charged particle beam executed by the plurality of image shift deflectors using the first control parameters and the second control parameters,
   wherein a charged particle optical system is composed of the charged particle source, the condenser lens, the object lens, and the plurality of image shift deflectors,
   wherein the optical axis of the charged particle beam is configured to pass through the intersection point of the principal surface of the object lens and the central axis of the charged particle optical system using the first control parameters, and
   wherein the second optical axis is configured so that the optical axis of the charged particle beam enters the specimen in parallel with the central axis of the charged particle optical system.

2. The charged particle beam apparatus according to claim 1,
   wherein the second control parameters have constant values regardless of an optical condition set for the charged particle optical system.

3. The charged particle beam apparatus according to claim 1,
   wherein the second control parameters are calculated using a correction function based on the excitation intensity of the object lens or the position of the object point of the charged particle beam.

4. The charged particle beam apparatus according to claim 1,
   wherein a charged particle optical system composed of the charged particle source, the condenser lens, the object lens, and the plurality of image shift deflectors is a charged particle optical system to which a deceleration method is not applied.

5. The charged particle beam apparatus according to claim 1, the charged particle beam apparatus further comprising a plurality of deflectors for two-dimensionally scanning the specimen to obtain the image of the specimen,
   wherein the plurality of image shift deflectors are disposed between the object lens and the charged particle source, and the plurality of deflectors are disposed between the object lens and the specimen mounting table.

6. The charged particle beam apparatus according to claim 1,
   wherein the openings of the magnetic path of the object lens look toward the optical axis of the charged particle beam.

7. A charged particle beam apparatus comprising:
   a charged particle source for generating a charged particle beam;
   a specimen mounting table for mounting a specimen;

a condenser lens and an object lens for converging the charged particle beam and irradiating the converged charged particle beam to the specimen;

a plurality of image shift deflectors for deflecting the charged particle beam;

a storage unit that stores first control parameters that set the optical axis of a charged particle beam to a first optical axis that enters a predefined position of the specimen, and second control parameters that transform the first control parameters so that the first control parameters set the optical axis of the charged particle beam from the first optical axis to a second optical axis that enters the specimen with a predefined incident angle different from the incident angle of the first optical axis, and a control unit, wherein the control unit updates the first control parameters by executing axis adjustment on the first optical axis set by the first control parameters, and controls the deflection of the charged particle beam executed by the plurality of image shift deflectors using control parameters obtained by transforming the updated first control parameters using the second control parameters, wherein a charged particle optical system is composed of the charged particle source, the condenser lens, the object lens, and the plurality of image shift deflectors, and wherein the second optical axis is configured so that the optical axis of the charged particle beam enters the specimen in parallel with the central axis of the charged particle optical system.

8. The charged particle beam apparatus according to claim 7, wherein a charged particle optical system composed of the charged particle source, the condenser lens, the object lens, and the plurality of image shift deflectors is a charged particle optical system to which a deceleration method is not applied.

9. The charged particle beam apparatus according to claim 7, wherein the openings of the magnetic path of the object lens look toward the optical axis of the charged particle beam.

10. A charged particle beam apparatus comprising:

a charged particle source for generating a charged particle beam;

a specimen mounting table for mounting a specimen;

a condenser lens and an object lens for converging the charged particle beam and irradiating the converged charged particle beam to the specimen;

a plurality of image shift deflectors for deflecting the charged particle beam;

a storage unit that stores first control parameters that set the optical axis of a charged particle beam to a first optical axis that passes the object lens center of the object lens and enters a predefined position of the specimen, second control parameters that transform the first control parameters so that the first control parameters set the optical axis of the charged particle beam from the first optical axis to a second optical axis that enters the specimen with a predefined incident angle different from the incident angle of the first optical axis, and a relational expression between the excitation intensity of the object lens and the shift amount of the visual field of the second optical axis; and a control unit, wherein the control unit executes a focus correction on the first optical axis that is set by the first control parameters, calculates the excitation intensity of the object lens after the focus correction, corrects the shift amount of the visual field of the second optical axis caused by the focus correction on the basis of the calculated excitation intensity of the object lens and the relational expression, and sets the optical axis of the charged particle beam from the first optical axis to the second optical axis, wherein a charged particle optical system is composed of the charged particle source, the condenser lens, the object lens, and the plurality of image shift deflectors, and wherein the second optical axis is configured so that the optical axis of the charged particle beam enters the specimen in parallel with the central axis of the charged particle optical system.

11. The charged particle beam apparatus according to claim 10, the charged particle beam apparatus controlling the deflection of the charged particle beam executed by the plurality of image shift deflectors using control parameters obtained by transforming the first control parameters for setting the optical axis of the charged particle beam to the first optical axis, the shift amount of the visual field of which is corrected, using the second control parameters.

12. The charged particle beam apparatus according to claim 10, wherein the storage unit stores a correction coefficient of the shift amount of the view field corresponding to the deflection amount caused by the plurality of image shift deflectors, and the shift amount of the view field is corrected on the basis of the correction coefficient.

13. The charged particle beam apparatus according to claim 10, wherein a charged particle optical system is composed of the charged particle source, the condenser lens, the object lens, and the plurality of image shift deflectors, and the optical axis of the charged particle beam is configured to pass through the intersection point of the principal surface of the object lens and the central axis of the charged particle optical system using the first control parameters.

14. The charged particle beam apparatus according to claim 10, wherein a charged particle optical system composed of the charged particle source, the condenser lens, the object lens, and the plurality of image shift deflectors is a charged particle optical system to which a deceleration method is not applied.

15. The charged particle beam apparatus according to claim 10, wherein the openings of the magnetic path of the object lens look toward the optical axis of the charged particle beam.

* * * * *